United States Patent
Nonaka et al.

(10) Patent No.: US 12,550,490 B2
(45) Date of Patent: Feb. 10, 2026

(54) GROUP-III ELEMENT NITRIDE SEMICONDUCTOR SUBSTRATE

(71) Applicant: NGK Insulators, Ltd., Nagoya (JP)

(72) Inventors: Kentaro Nonaka, Gifu (JP); Takayuki Hirao, Toyota (JP); Katsuhiro Imai, Nagoya (JP)

(73) Assignee: NGK INSULATORS, LTD., Nagoya (JP)

( * ) Notice: Subject to any disclaimer, the term of this patent is extended or adjusted under 35 U.S.C. 154(b) by 285 days.

(21) Appl. No.: 18/180,531

(22) Filed: Mar. 8, 2023

(65) Prior Publication Data
US 2023/0246132 A1      Aug. 3, 2023

Related U.S. Application Data

(63) Continuation of application No. PCT/JP2021/024916, filed on Jul. 1, 2021.

(30) Foreign Application Priority Data

Oct. 9, 2020    (JP) .................................. 2020-171075

(51) Int. Cl.
*H10H 20/825* (2025.01)
*H10H 20/81* (2025.01)

(52) U.S. Cl.
CPC ...... *H10H 20/825* (2025.01); *H10H 20/8215* (2025.01)

(58) Field of Classification Search
None
See application file for complete search history.

(56) References Cited

U.S. PATENT DOCUMENTS

| | | |
|---|---|---|
| 7,045,808 B2 | 5/2006 | Shibata |
| 11,339,053 B2 | 5/2022 | Fujikura et al. |

(Continued)

FOREIGN PATENT DOCUMENTS

| | | |
|---|---|---|
| CN | 111094638 A | 5/2020 |
| JP | 2005263609 A | 9/2005 |

(Continued)

OTHER PUBLICATIONS

English Translation of the International Preliminary Report on Patentability, issued in corresponding International Application No. PCT/JP2021/024916, Date of Mailing Apr. 20, 2023 (5 pages).

(Continued)

*Primary Examiner* — Bradley Smith
(74) *Attorney, Agent, or Firm* — FLYNN THIEL, P.C.

(57) ABSTRACT

There is provided a large-diameter Group-III element nitride semiconductor substrate including a first surface and a second surface, in which, despite its large diameter, variations in quality in the first surface are suppressed. A Group-III element nitride semiconductor includes: a first surface; and a second surface, wherein the Group-III element nitride semiconductor substrate has a diameter of 100 mm or more, and wherein the Group-III element nitride semiconductor substrate has a coefficient of variation of a yellow luminescence intensity in a range corresponding to 88% or more of an entire region of the first surface of 0.3 or less based on a photoluminescence spectrum obtained through photoluminescence measurement of a range of the entire region of the first surface.

10 Claims, 3 Drawing Sheets

(56) References Cited

U.S. PATENT DOCUMENTS

| | | |
|---|---|---|
| 11,437,233 B2 | 9/2022 | Goto et al. |
| 2015/0170901 A1 | 6/2015 | Motayed et al. |
| 2018/0237946 A1 | 8/2018 | Kiyama et al. |
| 2019/0119112 A1 | 4/2019 | Yoshida et al. |
| 2020/0227259 A1 | 7/2020 | Goto et al. |
| 2020/0227589 A1* | 7/2020 | Sakai ............ H10H 20/818 |

FOREIGN PATENT DOCUMENTS

| | | |
|---|---|---|
| JP | 5244628 B2 | 8/2010 |
| JP | 201168548 A | 4/2011 |
| JP | 6269368 B2 | 2/2016 |
| JP | 201674553 A | 5/2016 |
| JP | 6203460 B1 | 9/2017 |
| JP | 201952057 A | 4/2019 |
| JP | 202023427 A | 2/2020 |
| WO | 2019065689 A1 | 4/2019 |

OTHER PUBLICATIONS

International Search Report with English Translation issued in corresponding International Application No. PCT/JP2021/024916 date of mailing Aug. 31, 2021 (5 pages).

Written Opinion of International Searching Authority issued in corresponding International Application No. PCT/JP2021/024916 dated Aug. 31, 2021 (3 pages).

Japanese Office Action with English translation issued in corresponding Japanese Application No. 2021-557861 dated Nov. 30, 2021 (10 pages).

H. Osada et al., Development of Non-Core 4-inch GaN Substrate, Session 16.4, 2017 International Conference on Compound Semiconductor Manufacturing Technology, May 22 to May 25, 2017 (4 pages).

German Office Action with English translation issued in corresponding German Application No. 11 2021 003 768.2, mailed Jul. 29, 2025 (15 pages).

Chinese Office Action issued in corresponding Chinese Application No. 202180054550.X dated Dec. 23, 2025 (13 pages).

* cited by examiner

GROUP-III ELEMENT NITRIDE SEMICONDUCTOR SUBSTRATE

CROSS-REFERENCE TO RELATED APPLICATIONS

This application is a continuation under 35 U.S.C. 120 of International Application PCT/JP2021/024916 having the International Filing Date of 1 Jul. 2021 and having the benefit of the earlier filing date of Japanese Application No. 2020-171075, filed on 9 Oct. 2020. Each of the identified applications is fully incorporated herein by reference.

BACKGROUND OF THE INVENTION

1. Field of the Invention

The present invention relates to a Group-III element nitride semiconductor substrate. More specifically, the present invention relates to a large-diameter Group-III element nitride semiconductor substrate including a main surface and a back surface, which are in a front and back relationship, in which variations in quality in the main surface are suppressed.

2. Description of the Related Art

A Group-III element nitride semiconductor substrate, such as a gallium nitride (GaN) wafer, an aluminum nitride (AlN) wafer, or an indium nitride (InN) wafer, has been used as each of the substrates of various semiconductor devices (e.g., Patent Literature 1).

A semiconductor substrate includes a first surface and a second surface. When the first surface is defined as a main surface, and the second surface is defined as a back surface, the main surface is typically a Group-III element polar surface, and the back surface is typically a nitrogen polar surface. An epitaxial crystal may be grown on the main surface, and various devices may be produced thereon.

The Group-III element nitride semiconductor substrate has been used as a base substrate of a light-emitting device, such as an LED or an LD. In recent years, its application to a high-frequency/high-power electronic device has received attention. In particular, a device for handling large electric power entails an increase in element size, and hence the Group-III element nitride semiconductor substrate is required to be increased in diameter from 2 inches (diameter: 50.8 mm), which is the current mainstream, to 4 inches (about 100 mm), 6 inches (about 150 mm), or the like.

As technologies of a large-diameter Group-III element nitride semiconductor substrate, there have been reported: a substrate having a diameter of 100 mm or more produced through tiling of a seed substrate (Patent Literature 2); a substrate including 10 to 300 crystal polarity reverse regions (cores) in 4 inches (Non Patent Literature 1); and a substrate with a diameter of 100 mm or more including two regions having different deep emission intensities in micro photoluminescence mapping in a 2 mm square region (Patent Literature 3).

In each of such related-art technologies as described above, in addition to a c-plane, a region having a different crystal plane direction, such as a facet growth plane, is generated in a macro size at the time of crystal growth in the large-diameter Group-III element nitride semiconductor substrate. For example, a region in the vicinity of a tiling joint interface, the polarity reverse region (core), and the two regions having different deep emission intensities in micro photoluminescence mapping correspond thereto. The facet growth plane has higher inclusion of impurities than the c-plane, and hence the large-diameter Group-III element nitride semiconductor substrate including any such region as described above has an uneven concentration of impurities in the main surface, resulting in variations in quality in the main surface. Moreover, when the large-diameter Group-III element nitride semiconductor substrate has such variations in quality as described above in the main surface, variations occur in the characteristics of a device formed on the main surface.

CITATION LIST

Patent Literature

[PTL 1] JP 2005-263609 A
[PTL 2] JP 6203460 B1
[PTL 3] JP 6269368 B2

Non Patent Literature

[NPL 1] COMPOUND SEMICONDUCTOR MAN-TECH (2017 International Conference on Compound Semiconductor Manufacturing Technology (May 22-May 25, 2017)), Session 16.4, "Development of Non-Core 4-inch GaN Substrate," proceedings

SUMMARY OF THE INVENTION

An object of the present invention is to provide a large-diameter Group-III element nitride semiconductor substrate including a first surface and a second surface, in which, despite its large diameter, variations in quality in the first surface are suppressed.

A Group-III element nitride semiconductor substrate according to an embodiment of the present invention includes: a first surface; and a second surface, wherein the Group-III element nitride semiconductor substrate has a diameter of 100 mm or more, and wherein the Group-III element nitride semiconductor substrate has a coefficient of variation of a yellow luminescence intensity in a range corresponding to 88% or more of an entire region of the first surface of 0.3 or less based on a photoluminescence spectrum obtained through photoluminescence measurement of a range of the entire region of the first surface.

In one embodiment, the coefficient of variation is 0.2 or less.

In one embodiment, the Group-III element nitride semiconductor substrate has a coefficient of variation of a yellow luminescence intensity in a range corresponding to 92% or more of the entire region of the first surface of 0.3 or less based on a photoluminescence spectrum obtained through photoluminescence measurement of a range of the entire region of the first surface.

In one embodiment, the coefficient of variation is 0.2 or less.

In one embodiment, a measurement interval Y in the photoluminescence measurement is 1 mm or less.

In one embodiment, the Group-III element nitride semiconductor substrate has a warping of 100 μm or less.

DESCRIPTION OF THE EMBODIMENTS

Figure 1:
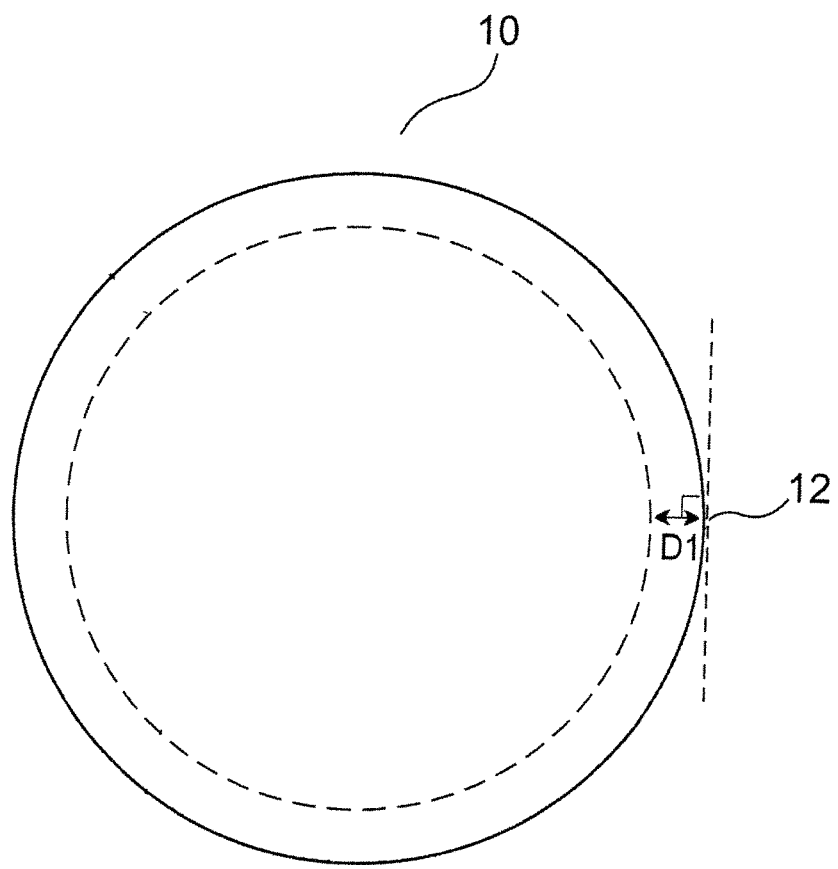
FIG. 1 is a typical schematic sectional view of a Group-III element nitride semiconductor substrate according to an embodiment of the present invention.

When the expression "weight" is used herein, the expression may be replaced with "mass" that is commonly used as an SI unit representing a weight.

A Group-III element nitride semiconductor substrate according to an embodiment of the present invention is typically a freestanding substrate formed of a Group-III element nitride crystal. In the description of the present invention, the term "freestanding substrate" means a substrate that is not deformed or broken by its own weight at the time of its handling, and hence can be handled as a solid. The freestanding substrate may be used as each of the substrates of various semiconductor devices, such as a light-emitting device and a power-controlling device.

The Group-III element nitride semiconductor substrate according to the embodiment of the present invention is typically a wafer shape (substantially complete round shape). However, the substrate may be processed into any other shape such as a rectangular shape as required.

The Group-III element nitride semiconductor substrate according to the embodiment of the present invention is a so-called large-diameter Group-III element nitride semiconductor substrate, and has a diameter of 100 mm or more. When the Group-III element nitride semiconductor substrate according to the embodiment of the present invention is such large-diameter substrate, the Group-III element nitride semiconductor substrate is easily applied to a high-frequency/high-power electronic device, particularly to such a device for handling large electric power as to entail an increase in element size.

Specific examples of the large-diameter Group-III element nitride semiconductor substrate include a 4-inch wafer, a 6-inch wafer, an 8-inch wafer, and a 12-inch wafer.

The thickness of the Group-III element nitride semiconductor substrate according to the embodiment of the present invention (when the thickness is not constant, the thickness of a site having the largest thickness) is preferably from 300 µm to 1,000 µm.

Typical examples of the Group-III element nitride include gallium nitride (GaN), aluminum nitride (AlN), indium nitride (InN), and a mixed crystal thereof. Those nitrides may be used alone or in combination thereof.

The Group-III element nitride is specifically GaN, AlN, InN, $Ga_xAl_{1-x}N$ (1>x>0), $Ga_xIn_{1-x}N$ (1>x>0), $Al_xIn_{1-x}N$ (1>x>0), or $Ga_xAl_yIn_zN$ (1>x>0, 1>y>0, x+y+z=1). Those nitrides may be doped with various n-type dopants or p-type dopants.

Typical examples of the p-type dopants include beryllium (Be), magnesium (Mg), strontium (Sr), and cadmium (Cd). Those dopants may be used alone or in combination thereof.

Typical examples of the n-type dopants include silicon (Si), germanium (Ge), tin (Sn), and oxygen (O). Those dopants may be used alone or in combination thereof.

The plane direction of the Group-III element nitride semiconductor substrate may be set to any one of a c-plane, an m-plane, an a-plane, and a specific crystal plane tilted from each of the c-plane, the a-plane, and the m-plane, and particularly when the plane direction is set to the c-plane, the effects of the present invention are expressed to a larger extent. Examples of the specific crystal plane tilted from each of the c-plane, the a-plane, and the m-plane may include so-called semipolar planes, such as a {11-22} plane and a {20-21} plane. In addition, the plane direction is permitted to include not only a so-called just plane vertical to the c-plane, the a-plane, the m-plane, or the specific crystal plane tilted from each of the planes but also an off angle in the range of ±5°.

The Group-III element nitride semiconductor substrate according to the embodiment of the present invention is a Group-III element nitride semiconductor substrate including a first surface and a second surface. When the first surface is defined as a main surface, and the second surface is defined as a back surface, as long as the plane direction of the Group-III element nitride semiconductor substrate is the c-plane, the main surface is typically a Group-III element polar surface, and the back surface is typically a nitrogen polar surface. However, the main surface may be set to the nitrogen polar surface, and the back surface may be set to the Group-III element polar surface. An epitaxial crystal may be grown on the main surface, and various devices may be produced thereon. The back surface may be held with a susceptor or the like to transfer the Group-III element nitride semiconductor substrate according to the embodiment of the present invention.

In the description of the Group-III element nitride semiconductor substrate according to the embodiment of the present invention, the first surface is described as the main surface, and the second surface is described as the back surface. Accordingly, in this description, the term "main surface" may be replaced with "first surface," the term "first surface" may be replaced with "main surface," the term "back surface" may be replaced with "second surface," and the term "second surface" may be replaced with "back surface."

The main surface may be a mirror surface or a non-mirror surface. The main surface is preferably a mirror surface.

The main surface is preferably a surface from which an affected layer is substantially removed and which has a small surface roughness in a microscopic region from the viewpoint of obtaining such a semiconductor substrate that devices to be produced by epitaxially growing device layers have satisfactory characteristics and variations in device characteristics between the devices are reduced.

The back surface may be a mirror surface or a non-mirror surface.

The term "mirror surface" refers to a surface subjected to mirror processing, the surface being brought into a state in which the roughness and waviness of the surface are reduced to such an extent that light is reflected after the mirror processing, and hence the fact that an object is reflected on the surface subjected to the mirror processing can be visually observed. In other words, the term refers to a surface in a state in which the magnitude of each of the roughness and waviness of the surface after the mirror processing is reduced to such an extent as to be sufficiently negligible with respect to the wavelength of visible light. An epitaxial crystal can be sufficiently grown on the surface subjected to the mirror processing.

Any appropriate method may be adopted as a method for the mirror processing to the extent that the effects of the present invention are not impaired. An example of such method is a method including performing the mirror processing through use of one, or a combination of two or more, of the following apparatus: a polishing apparatus using a tape; a lapping apparatus using diamond abrasive grains; and a chemical mechanical polish (CMP) apparatus using a slurry such as colloidal silica and a polishing pad made of a nonwoven fabric. When the affected layer remains on the surface after the processing, the affected layer is removed. As a method of removing the affected layer, there are given, for example, a method including removing the affected layer through use of reactive ion etching (RIE) or a chemical liquid, and a method including annealing the substrate.

The term "non-mirror surface" refers to a surface that is not subjected to mirror processing, and a typical example thereof is a rough surface obtained by surface-roughening treatment.

Any appropriate method may be adopted as a method for the surface-roughening treatment to the extent that the effects of the present invention are not impaired. Examples of such method include: grinding with abrasive stone; laser texture processing; etching treatment with various chemical liquids and gases; physical or chemical coating treatment; and texturing by machining.

FIG. 1 is a typical schematic sectional view of the Group-III element nitride semiconductor substrate according to the embodiment of the present invention. As illustrated in FIG. 1, a Group-III element nitride semiconductor substrate 100 according to the embodiment of the present invention typically has a main surface (Group-III element polar surface) 10 and a back surface (nitrogen polar surface) 20. The Group-III element nitride semiconductor substrate 100 according to the embodiment of the present invention may have a side surface 30.

An end portion of the Group-III element nitride semiconductor substrate according to the embodiment of the present invention may adopt any appropriate form to the extent that the effects of the present invention are not impaired. Examples of the shape of the end portion of the Group-III element nitride semiconductor substrate according to the embodiment of the present invention include: a shape in which a main surface side and a back surface side are each chamfered so as to be a flat surface; a shape in which the main surface side and the back surface side are each chamfered in an R-shape; a shape in which only the main surface side of the end portion is chamfered so as to be a flat surface; and a shape in which only the back surface side of the end portion is chamfered so as to be a flat surface.

When the end portion of the Group-III element nitride semiconductor substrate according to the embodiment of the present invention is chamfered, the chamfered portion may be arranged over the one entire round of an outer peripheral portion, or may be arranged only in part of the outer peripheral portion.

The Group-III element nitride semiconductor substrate according to the embodiment of the present invention has a coefficient of variation of a yellow luminescence intensity in a range corresponding to 88% or more of the entire region of the main surface of 0.3 or less, preferably 0.25 or less, more preferably 0.2 or less, particularly preferably 0.17 or less, based on a photoluminescence spectrum obtained through photoluminescence measurement of a range of the entire region of the main surface. When the coefficient of variation is adjusted within the above-mentioned ranges, a Group-III element nitride semiconductor substrate, in which, despite its large diameter, variations in quality in the main surface are suppressed, can be provided.

The photoluminescence spectrum obtained through photoluminescence measurement of the surface of the Group-III element nitride semiconductor substrate reflects impurities in a crystal of the semiconductor substrate or a defect (atomic vacancy or the like) resulting from the impurities. Accordingly, the yellow luminescence intensity serves as a quality indicator of the Group-III element nitride semiconductor substrate. Moreover, when the photoluminescence measurement is performed on a range of the entire region of the main surface of the Group-III element nitride semiconductor substrate, variations in impurities or in defect (atomic vacancy or the like) resulting from the impurities in the entire region of the main surface of the Group-III element nitride semiconductor substrate can be grasped.

The Group-III element nitride semiconductor substrate according to the embodiment of the present invention has a coefficient of variation of a yellow luminescence intensity in a range corresponding to 92% or more of the entire region of the main surface of preferably 0.3 or less, more preferably 0.25 or less, still more preferably 0.2 or less, particularly preferably 0.18 or less, based on a photoluminescence spectrum obtained through photoluminescence measurement of a range of the entire region of the main surface. When the coefficient of variation is adjusted within the above-mentioned ranges, a Group-III element nitride semiconductor substrate, in which, despite its large diameter, variations in quality in the main surface are further suppressed, can be provided.

Herein, the "coefficient of variation of a yellow luminescence intensity in a range corresponding to X % of the entire region of the main surface based on a photoluminescence spectrum obtained through photoluminescence measurement of a range of the entire region of the main surface" refers to a value obtained as follows. From a photoluminescence spectrum acquired by performing photoluminescence measurement on a range of the entire region of the main surface at a predetermined measurement interval Y, the average and standard deviation of yellow luminescence intensities in the range corresponding to X % of the entire region of the main surface are determined, and a value for the coefficient of variation is calculated by (standard deviation/average of yellow luminescence intensities).

The measurement interval Y in the photoluminescence measurement is preferably 1 mm or less. When the measurement interval Y in the photoluminescence measurement is set to 1 mm or less, a Group-III element nitride semiconductor substrate, in which, despite its large diameter, variations in quality in the main surface are further suppressed, can be provided.

Figure 2:
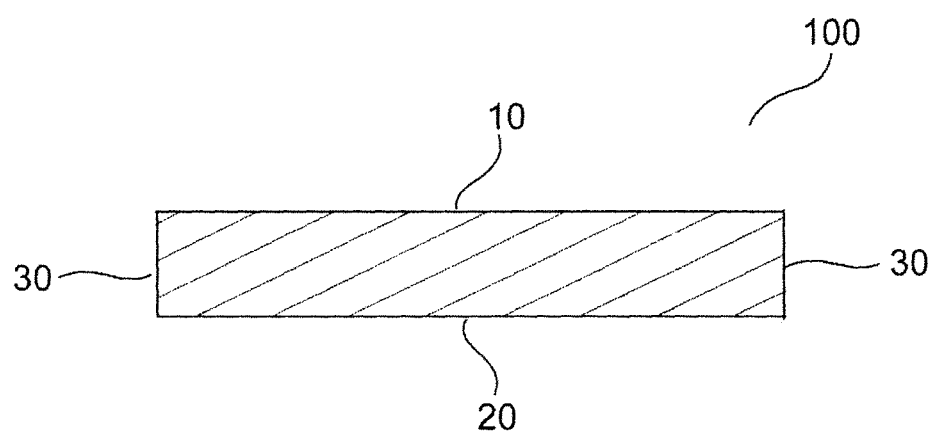
FIG. 2 is a typical schematic plan view of the Group-III element nitride semiconductor substrate according to the embodiment of the present invention when seen from a first surface side.

The "X %" means a ratio of a region except any appropriate region from the entire region of the main surface. The any appropriate region is typically a region of an outer peripheral portion in which no device is formed. As illustrated in FIG. 2, the outer peripheral portion, which is such device non-formation region, is a region having a distance of a width D1 from an outer peripheral end portion 12 toward an internal side direction of the main surface 10 over the entire round. The width D1 of the outer peripheral portion of the main surface is a distance starting from the outer peripheral end portion 12, and is a distance toward the internal side direction of the main surface 10 and in a normal direction to a tangent at the outer peripheral end portion 12. The width D1 is preferably constant.

Any appropriate width may be adopted as the width D1 to the extent that the effects of the present invention are not impaired. The width D1 is preferably 5 mm or less, more preferably 4 mm or less, still more preferably 3 mm or less, particularly preferably 2 mm or less, most preferably 1 mm or less because the effects of the present invention can be expressed to a larger extent. The lower limit value of the width D1 is preferably 0.3 mm or more because the effects of the present invention can be expressed to a larger extent.

Despite the fact that the Group-III element nitride semiconductor substrate according to the embodiment of the present invention has a large diameter, variations in quality in the main surface thereof are suppressed, and hence the Group-III element nitride semiconductor substrate has small warping. The warping is preferably 100 μm or less, more preferably 80 μm or less, still more preferably 50 μm or less, particularly preferably 30 μm or less.

The Group-III element nitride semiconductor substrate according to the embodiment of the present invention may be produced by any appropriate method to the extent that the effects of the present invention are not impaired. In terms of expressing the effects of the present invention to a larger extent, a preferred method of producing the Group-III element nitride semiconductor substrate according to the embodiment of the present invention is described below.

Figure 3A:
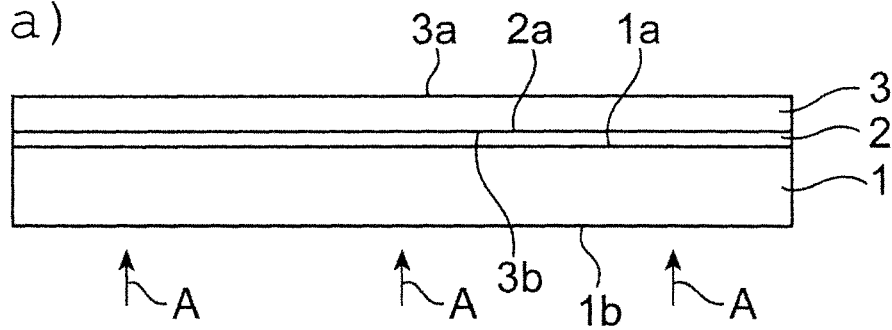
FIGS. 3(a), 3(b) and 3(c) are schematic explanatory views for illustrating a method of producing the Group-III element nitride semiconductor substrate according to the embodiment of the present invention.
Figure 3B:
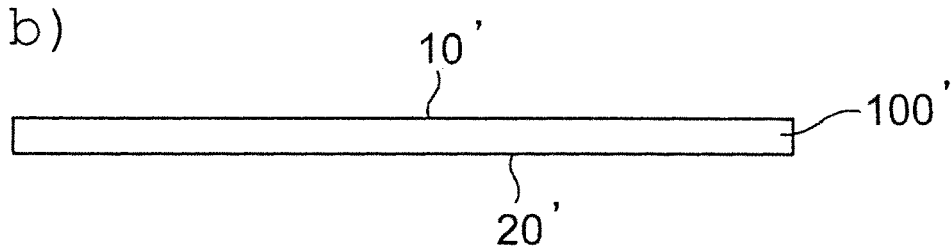

In the Group-III element nitride semiconductor substrate according to the embodiment of the present invention, typically, as illustrated in FIG. 3(a), a seed crystal film 2 is formed on a main surface 1a of a base substrate 1, and a Group-III element nitride layer 3 is formed on a Group-III element polar surface 2a of the seed crystal film 2. Next, a Group-III element nitride layer (seed crystal film 2+Group-III element nitride layer 3) serving as a freestanding substrate is separated from the base substrate 1. Thus, a freestanding substrate 100' having a main surface 10' and a back surface 20' is obtained.

Any appropriate material may be adopted as a material for the base substrate to the extent that the effects of the present invention are not impaired. Examples of such material include sapphire, crystal oriented alumina, gallium oxide, $Al_xGa_{1-x}N$ (0≤x≤1), GaAs, and SiC.

Any appropriate material may be adopted as a material for the seed crystal film to the extent that the effects of the present invention are not impaired. Examples of such material include $Al_xGa_{1-x}N$ (0≤x<1) and $In_xGa_{1-x}Na$ (0≤x≤1). Of those, gallium nitride is preferred. The material for the seed crystal film is more preferably gallium nitride that is recognized to show a yellow luminescence effect when observed with a fluorescence microscope. The term "yellow luminescence" refers to a peak (yellow luminescence (YL) or a yellow band (YB)) appearing in the range of from 2.2 eV to 2.5 eV in addition to an exciton transition (UV) from a band to another band.

Any appropriate formation method may be adopted as a method of forming the seed crystal film to the extent that the effects of the present invention are not impaired. Such formation method is, for example, a vapor growth method, and preferred examples thereof include a metal-organic chemical vapor deposition (MOCVD) method, a hydride vapor phase epitaxy (HVPE) method, a pulsed excitation deposition (PXD) method, a molecular beam epitaxy (MBE) method, and a sublimation method. Of those, a metal-organic chemical vapor deposition (MOCVD) method is more preferred as the method of forming the seed crystal film.

The formation of the seed crystal film by the MOCVD method is preferably performed by, for example, depositing a low-temperature grown buffer layer by from 20 nm to 50 nm at from 450° C. to 550° C., and then laminating a film having a thickness of from 2 μm to 4 μm at from 1,000° C. to 1,200° C.

Any appropriate growth direction may be adopted as the growth direction of a Group-III element nitride crystal layer to the extent that the effects of the present invention are not impaired. Examples of such growth direction include: the normal direction of the c-plane of a wurtzite structure; the normal direction of each of the a-plane and m-plane thereof; and the normal direction of a plane tilted from each of the c-plane, the a-plane, and the m-plane.

Any appropriate formation method may be adopted as a method of forming the Group-III element nitride crystal layer to the extent that the effects of the present invention are not impaired as long as a layer to be formed by the method has a crystal direction substantially following the crystal direction of the seed crystal film. Examples of such formation method include: gas phase growth methods, such as a metal-organic chemical vapor deposition (MOCVD) method, a hydride vapor phase epitaxy (HVPE) method, a pulsed excitation deposition (PXD) method, a molecular beam epitaxy (MBE) method, and a sublimation method; liquid phase growth methods, such as a Na flux method, an ammonothermal method, a hydrothermal method, and a sol-gel method; a powder growth method utilizing solid phase growth of powder; and a combination thereof.

When the Na flux method is adopted as the method of forming the Group-III element nitride crystal layer, the Na flux method is preferably performed in conformity with a production method described in JP 5244628 B2 by appropriately adjusting the conditions and the like so that the effects of the present invention can be expressed to a larger extent.

The formation of the Group-III element nitride crystal layer by the Na flux method is typically preferably performed as follows: a seed crystal substrate (base substrate+seed crystal film) is arranged in a crucible serving as a growing container under a nitrogen atmosphere; a melt composition containing a Group-III element, metal Na, and as required, a dopant (e.g., an n-type dopant, such as germanium (Ge), silicon (Si), or oxygen (O); or a p-type dopant, such as beryllium (Be), magnesium (Mg), calcium (Ca), strontium (Sr), zinc (Zn), or cadmium (Cd)) is further loaded into the crucible; the crucible is lidded; the lidded crucible is loaded into an external container; the external container is further loaded into a pressure-resistant container; and under a nitrogen atmosphere, after the temperature and pressure of the container are increased to preferably from 700° C. to 1,000° C. (more preferably from 800° C. to 900° C.) and preferably from 1 MPa to 7 MPa (more preferably from 2 MPa to 6 MPa), respectively, the container is rotated while the temperature and the pressure are retained.

Any appropriate crucible that may be used for the Na flux method may be adopted as the crucible to the extent that the effects of the present invention are not impaired. An alumina crucible coated with aluminum nitride (AlN) is preferably adopted as the crucible because the effects of the present invention can be expressed to a larger extent. An aluminum nitride (AlN) crucible that has hitherto been adopted has problems in that it is difficult to increase the size of the crucible and the crucible has high cost. Meanwhile, the alumina crucible coated with aluminum nitride (AlN) is easily increased in size, and hence is suitable for production of the large-diameter Group-III element nitride semiconductor substrate. In addition, when the alumina crucible coated with aluminum nitride (AlN) is adopted, mixing of impurities such as oxygen can be effectively reduced. Thus, a Group-III element nitride semiconductor substrate, in which, despite its large diameter, variations in quality in the main surface are further suppressed, can be finally provided.

Any appropriate lid of a crucible that may be used for the Na flux method may be adopted as the lid of the crucible to the extent that the effects of the present invention are not impaired. An alumina lid coated with aluminum nitride (AlN) is preferably adopted as the lid of the crucible because the effects of the present invention can be expressed to a larger extent. When the alumina lid coated with aluminum nitride (AlN) is adopted, mixing of impurities such as oxygen can be effectively reduced. Thus, a Group-III element nitride semiconductor substrate, in which, despite its large diameter, variations in quality in the main surface are further suppressed, can be finally provided.

The rotation is typically performed as follows: the container is placed on a rotating table; and the container is rotated about a center axis with a constant period.

The rotation is performed so that a crystal growth rate of the Group-III element nitride crystal layer on the seed crystal substrate is preferably from 5 μm/h to 25 μm/h, more preferably from 10 μm/h to 25 μm/h. When the crystal growth rate of the Group-III element nitride crystal layer on the seed crystal substrate is less than 5 μm/h, a crystal growth time is excessively prolonged, and actual production may be difficult. When the crystal growth rate is more than 25 μm/h, the content of an inclusion may be increased.

The rotation is preferably performed as follows: (i) rotation in one direction is performed without reverse rotation; (ii) a reverse operation including rotation in one direction for 1 minute or more and subsequent rotation in the opposite direction for 1 minute or more is repeated; or (iii) an intermittent operation including rotation in one direction for 5 seconds or more, followed by stopping for 0.1 second or more, and subsequent rotation in the same direction for 5 seconds or more is repeated. In the case of the above-mentioned item (ii) or (iii), when the reverse operation or the intermittent operation is repeated with a period shorter than the above-mentioned period, the crystal growth rate is excessively increased, and the content of an inclusion may be increased.

The rotation is preferably performed by clockwise motion and counterclockwise motion with a constant period because the effects of the present invention can be expressed to a larger extent.

The rotation is rotation including clockwise motion and counterclockwise motion with a constant period, and the maximum rotation speed is preferably 10 rpm or more, more preferably 20 rpm or more, still more preferably 30 rpm or more, particularly preferably 40 rpm or more, because the effects of the present invention can be expressed to a larger extent. The upper limit of the maximum rotation speed is typically 100 rpm or less. When the maximum rotation speed is adjusted within the above-mentioned ranges, inclusion of impurities in a crystal becomes uniform in a plane. Finally, a Group-III element nitride semiconductor substrate, in which, despite its large diameter, variations in quality in the main surface are further suppressed, can be provided.

Any appropriate time may be set as a retention time at the maximum rotation speed depending on the target thickness of the Group-III element nitride crystal layer. The retention time at the maximum rotation speed is preferably from 10 seconds to 100 hours, more preferably from 50 seconds to 10 hours, still more preferably from 100 seconds to 1 hour, particularly preferably from 300 seconds to 30 minutes.

A time for the rotation includes, in addition to the retention time at the maximum rotation speed, an acceleration time to reach the maximum rotation speed, a deceleration time from the maximum rotation speed to stop for shifting to reverse motion, and a stop time from the stop to start of acceleration in reverse motion.

The acceleration time is preferably one-hundredth or more of the retention time, more preferably one-sixtieth or more of the retention time, still more preferably one-fortieth or more of the retention time, particularly preferably one-thirtieth or more of the retention time, most preferably one-twentieth or more of the retention time because the effects of the present invention can be expressed to a larger extent. The maximum value of the acceleration time is typically equal to or shorter than the retention time. When the acceleration time is adjusted within the above-mentioned ranges, inclusion of impurities in a crystal becomes uniform in a plane. Finally, a Group-III element nitride semiconductor substrate, in which, despite its large diameter, variations in quality in the main surface are further suppressed, can be provided.

Specifically, the acceleration time is preferably 6 seconds or more, more preferably 10 seconds or more, still more preferably 15 seconds or more, even still more preferably 20 seconds or more, particularly preferably 30 seconds or more, most preferably 40 seconds or more because the effects of the present invention can be expressed to a larger extent. The maximum value of the acceleration time is typically 600 seconds or less. When the acceleration time is adjusted within the above-mentioned ranges, inclusion of impurities in a crystal becomes uniform in a plane. Finally, a Group-III element nitride semiconductor substrate, in which, despite its large diameter, variations in quality in the main surface are further suppressed, can be provided.

The deceleration time is preferably one-hundredth or more of the retention time, more preferably one-sixtieth or more of the retention time, still more preferably one-fortieth or more of the retention time, particularly preferably one-thirtieth or more of the retention time, most preferably one-twentieth or more of the retention time because the effects of the present invention can be expressed to a larger extent. The maximum value of the deceleration time is typically equal to or shorter than the retention time. When the deceleration time is adjusted within the above-mentioned ranges, inclusion of impurities in a crystal becomes uniform in a plane. Finally, a Group-III element nitride semiconductor substrate, in which, despite its large diameter, variations in quality in the main surface are further suppressed, can be provided.

Specifically, the deceleration time is preferably 6 seconds or more, more preferably 10 seconds or more, still more preferably 15 seconds or more, even still more preferably 20 seconds or more, particularly preferably 30 seconds or more, most preferably 40 seconds or more because the effects of the present invention can be expressed to a larger extent. The maximum value of the deceleration time is typically 600 seconds or less. When the deceleration time is adjusted within the above-mentioned ranges, inclusion of impurities in a crystal becomes uniform in a plane. Finally, a Group-III element nitride semiconductor substrate, in which, despite its large diameter, variations in quality in the main surface are further suppressed, can be provided.

The stop time is typically from 0.1 second to 5 seconds.

Next, the freestanding substrate including the Group-III element nitride crystal layer may be obtained by separating the Group-III element nitride crystal layer from the base substrate.

Any appropriate method may be adopted as a method of separating the Group-III element nitride crystal layer from the base substrate to the extent that the effects of the present invention are not impaired. Examples of such method include: a method including causing the Group-III element nitride crystal layer to spontaneously separate from the base substrate through use of a thermal shrinkage difference in a temperature decrease step after the growth of the Group-III element nitride crystal layer; a method including separating the Group-III element nitride crystal layer from the base substrate through chemical etching; a method including peeling the Group-III element nitride crystal layer from the base substrate by a laser lift-off method including applying laser light from a back surface 1b side of the base substrate 1 as indicated by the arrows A, as illustrated in FIG. 3(a); and a method including peeling the Group-III element nitride crystal layer from the base substrate through grinding. In addition, the freestanding substrate including the Group-III element nitride crystal layer may be obtained by slicing the Group-III element nitride crystal layer through utilization of a wire saw or the like.

In the Group-III element nitride crystal layer thus obtained by the Na flux method, it is preferred that a plate surface thereof be flattened by being ground with abrasive stone or the like, and the plate surface be then smoothened, for example, by being lapped with diamond abrasive grains.

Next, the freestanding substrate is shaped into a circular shape having a desired diameter by grinding its outer peripheral portion.

The present invention is directed to a so-called large-diameter Group-III element nitride semiconductor substrate, and hence the freestanding substrate has a size of 100 mm or more as a diameter. When the Group-III element nitride semiconductor substrate according to the embodiment of the present invention is such large-diameter substrate, the Group-III element nitride semiconductor substrate is easily applied to a high-frequency/high-power electronic device, particularly to such a device for handling large electric power as to entail an increase in element size.

Specific examples of the large-diameter Group-III element nitride semiconductor substrate include a 4-inch wafer, a 6-inch wafer, an 8-inch wafer, and a 12-inch wafer.

Next, the main surface and/or the back surface is subjected to removal processing by, for example, grinding, lapping, or polishing so that the semiconductor substrate is turned into a thin plate having a desired thickness, followed by flattening. Thus, a freestanding substrate is obtained.

The thickness of the freestanding substrate (when the thickness is not constant, the thickness of a site having the largest thickness) is preferably from 300 µm to 1,000 µm.

The outer peripheral edge of the freestanding substrate is chamfered through grinding as required. Finally, the Group-III element nitride semiconductor substrate 100 according to the embodiment of the present invention is obtained.

Figure 3C:
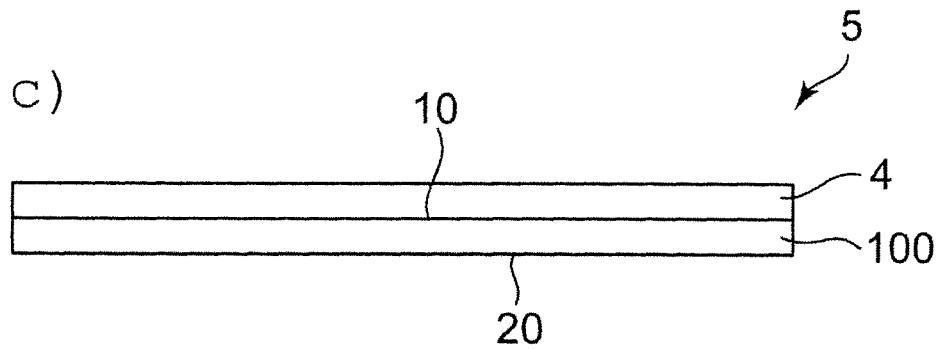

A crystal can be epitaxially grown on the main surface (Group-III element polar surface) 10 of the Group-III element nitride semiconductor substrate 100 to be obtained, and the formation of a functional layer 4 as illustrated in FIG. 3(c) provides a functional element 5. Reference numeral 20 represents the back surface (nitrogen polar surface) of the substrate.

The epitaxial crystal to be grown on the Group-III element nitride semiconductor substrate to be obtained may be, for example, gallium nitride, aluminum nitride, indium nitride, or a mixed crystal thereof. Specific examples of such epitaxial crystal include GaN, AlN, InN, $Ga_xAl_{1-x}N$ (1>x>0), $Ga_xIn_{1-x}N$ (1>x>0), $Al_xIn_{1-x}N$ (1>x>0), and $Ga_x$-$Al_yIn_zN$ (1>x>0, 1>y>0, x+y+z=1). In addition, examples of the functional layer to be arranged on the Group-III element nitride semiconductor substrate to be obtained include a rectifying element layer, a switching element, and a power semiconductor layer in addition to a light-emitting layer. In addition, the thickness and thickness distribution of the freestanding substrate may be reduced by subjecting the nitrogen polar surface to processing, such as grinding or polishing, after the arrangement of the functional layer on the Group-III element polar surface of the Group-III element nitride semiconductor substrate to be obtained.

EXAMPLES

The present invention is specifically described below by way of Examples. However, the present invention is by no means limited to Examples. Test and evaluation methods in Examples and the like are as described below. The term "part(s)" in the following description means "part(s) by weight" unless otherwise specified, and the term "%" in the following description means "wt %" unless otherwise specified.

<Photoluminescence Measurement>
(Measurement Method)

A photoluminescence spectrum was acquired with a photoluminescence mapping device (DUV-PL, manufactured by PHOTON Design Corporation) using a He—Cd laser at an excitation wavelength of 325 nm at room temperature (25° C.) under the conditions of an excitation intensity of 10 $W/cm^2$, an exposure time of 10 msec, a measurement wavelength range of from 330 nm to 680 nm, and a wavelength resolution of 0.5 nm. The entire region of a main surface of a Group-III element nitride semiconductor substrate was subjected to the measurement so that an interval between measurement points became 1 mm or less.

(Calculation of Coefficient of Variation of Yellow Luminescence Intensity)

The intensity (unit: a.u) of a peak in a wavelength range of from 480 nm to 580 nm in the acquired photoluminescence spectrum was defined as a yellow luminescence intensity. The average and standard deviation of yellow luminescence intensities in a range corresponding to X % of the entire region of the main surface were determined, and a coefficient of variation was calculated by (standard deviation/average of yellow luminescence intensities).

<Measurement of Warping>

The warping of a main surface of a Group-III element nitride semiconductor substrate was measured, and the radius of curvature thereof was calculated from the warping. The warping may be measured with a laser displacement sensor. The "laser displacement sensor" refers to an apparatus for measuring the displacement of each surface thereof by irradiating the surface with laser light. The wavelength of the laser light is set to 655 nm, and a confocal system, a triangular ranging system, or an optical interference system may be used as a measurement system in accordance with surface roughness.

A waveform was obtained except for a range having a width of 3 mm from an end of the substrate. Next, a curve approximate to the waveform was obtained by a least-squares method using a quadratic function. A difference between the maximum value and minimum value of the approximate curve was measured on each of two axes perpendicular to each other on the surface of the substrate, and the average of the two values was defined as a warping S.

Example 1

A seed crystal film made of gallium nitride having a thickness of 2 µm was formed on a sapphire substrate having a diameter of 4 inches by a MOCVD method to provide a seed crystal substrate.

The resultant seed crystal substrate was arranged in an alumina crucible coated with AlN in a glove box under a nitrogen atmosphere.

Next, metal gallium and metal sodium were loaded into the crucible so that the following ratio was obtained: Ga/(Ga+Na) (mol %)=15 mol %. The crucible was lidded with an alumina lid coated with AlN.

The lidded crucible was loaded into an internal container made of stainless steel, and was further loaded into an external container made of stainless steel capable of housing the internal container. The external container was closed with a container lid equipped with a nitrogen introduction pipe. The external container was arranged on a rotating table placed on a heating portion in a crystal production apparatus having been vacuum-baked in advance, and a pressure-resistant container storing the external container was lidded and sealed.

Next, an inside of the pressure-resistant container was evacuated to 0.1 Pa or less with a vacuum pump. Subsequently, while an upper-stage heater, a middle-stage heater, and a lower-stage heater were adjusted to perform heating so that a heated space had a temperature of 870° C., a nitrogen gas was introduced from a nitrogen gas cylinder up to 4.0 MPa, and the external container was rotated about a center axis at 40 rpm in clockwise motion and counterclockwise motion with a constant period. The rotation conditions were set as follows: an acceleration time of 60 seconds, a retention time of 600 seconds, a deceleration time of 60 seconds, and a stop time of 0.5 second. The container was retained under that state for 40 hours, and was then naturally cooled to room temperature and reduced in pressure to atmospheric pressure. After that, the lid of the pressure-resistant container was opened, and the crucible was taken out therefrom. Solidified metal sodium in the crucible was removed, and a gallium nitride freestanding crystal without cracks was peeled from the seed crystal substrate and collected.

The front surface and back surface of the gallium nitride freestanding crystal were polished. Thus, a wafer (1) serving as a gallium nitride freestanding substrate was produced.

The wafer (1) had a warping of 40 μm.

Photoluminescence measurement was performed on the main surface of the wafer (1). The photoluminescence measurement was performed on 8,000 points at intervals of 1 mm in the main surface.

In spectral data of the respective measurement points obtained in the photoluminescence measurement, band-edge luminescence (BEL) having a peak around a wavelength of 365 nm and yellow luminescence (deep luminescence) having a peak in a wavelength range of from 500 nm to 600 nm were observed.

In order to eliminate an influence of a device non-formation region in the outermost peripheral portion of the wafer (1), a region having a width of 3 mm from the outer peripheral end portion of the main surface was excluded, and the average and standard deviation of yellow luminescence intensities in a range corresponding to 88% of the entire region of the main surface were determined. As a result, an average of yellow luminescence intensities of 176 (unit: a.u), and a standard deviation of 27 (unit: a.u) were obtained, and a coefficient of variation represented by (standard deviation/average of yellow luminescence intensities) was 0.15.

Further, on the assumption that the wafer (1) was used as a chip-size small device, such as an LED or a laser diode, a region having a width of 2 mm from the outer peripheral end portion of the main surface was excluded, and the average and standard deviation of yellow luminescence intensities in a range corresponding to 92% of the entire region of the main surface were determined. As a result, an average of yellow luminescence intensities of 178 (unit: a.u), and a standard deviation of 29 (unit: a.u) were obtained, and a coefficient of variation represented by (standard deviation/average of yellow luminescence intensities) was 0.16.

Example 2

A wafer (2) was produced in the same manner as in Example 1 except that a sapphire substrate having a diameter of 6 inches was used in place of the sapphire substrate having a diameter of 4 inches.

The wafer (2) had a warping of 80 μm.

Photoluminescence measurement was performed on the main surface of the wafer (2). The photoluminescence measurement was performed on 17,189 points at intervals of 1 mm in the main surface.

In spectral data of the respective measurement points obtained in the photoluminescence measurement, band-edge luminescence (BEL) having a peak around a wavelength of 365 nm and yellow luminescence (deep luminescence) having a peak in a wavelength range of from 500 nm to 600 nm were observed.

In order to eliminate an influence of a device non-formation region in the outermost peripheral portion of the wafer (2), a region having a width of 3 mm from the outer peripheral end portion of the main surface was excluded, and the average and standard deviation of yellow luminescence intensities in a range corresponding to 94% of the entire region of the main surface were determined. As a result, an average of yellow luminescence intensities of 210 (unit: a.u), and a standard deviation of 57 (unit: a.u) were obtained, and a coefficient of variation represented by (standard deviation/average of yellow luminescence intensities) was 0.27.

Comparative Example 1

A seed crystal film made of gallium nitride having a thickness of 2 μm was formed on a sapphire substrate having a diameter of 4 inches by a MOCVD method to provide a seed crystal substrate.

The resultant seed crystal substrate was arranged in an alumina crucible in a glove box under a nitrogen atmosphere.

Next, metal gallium and metal sodium were loaded into the crucible so that the following ratio was obtained: Ga/(Ga+Na) (mol %)=15 mol %. The crucible was lidded with an alumina plate.

The lidded crucible was loaded into an internal container made of stainless steel, and was further loaded into an external container made of stainless steel capable of housing the internal container. The external container was closed with a container lid equipped with a nitrogen introduction pipe. The external container was arranged on a rotating table placed on a heating portion in a crystal production apparatus having been vacuum-baked in advance, and a pressure-resistant container storing the external container was lidded and sealed.

Next, an inside of the pressure-resistant container was evacuated to 0.1 Pa or less with a vacuum pump. Subsequently, while an upper-stage heater, a middle-stage heater, and a lower-stage heater were adjusted to perform heating so that a heated space had a temperature of 870° C., a nitrogen gas was introduced from a nitrogen gas cylinder up to 4.0 MPa, and the external container was rotated about a center axis at 20 rpm in clockwise motion and counterclockwise motion with a constant period. The rotation conditions were set as follows: an acceleration time of 12 seconds, a retention time of 600 seconds, a deceleration time of 12 seconds, and a stop time of 0.5 second. The container was retained under that state for 40 hours, and was then naturally cooled to room temperature and reduced in pressure to atmospheric pressure. After that, the lid of the pressure-resistant container was opened, and the crucible was taken out therefrom. Solidified metal sodium in the crucible was removed, and a gallium nitride freestanding crystal without cracks was peeled from the seed crystal substrate and collected.

The front surface and back surface of the gallium nitride freestanding crystal were polished. Thus, a wafer (C1) serving as a gallium nitride freestanding substrate was produced.

The wafer (C1) had a warping of 121 μm.

Photoluminescence measurement was performed on the main surface of the wafer (C1). The photoluminescence measurement was performed on 8,000 points at intervals of 1 mm in the main surface.

In spectral data of the respective measurement points obtained in the photoluminescence measurement, band-edge luminescence (BEL) having a peak around a wavelength of 365 nm and yellow luminescence (deep luminescence) having a peak in a wavelength range of from 500 nm to 600 nm were observed.

In order to eliminate an influence of a device non-formation region in the outermost peripheral portion of the wafer (C1), a region having a width of 3 mm from the outer peripheral end portion of the main surface was excluded, and the average and standard deviation of yellow luminescence intensities in a range corresponding to 88% of the entire region of the main surface were determined. As a result, an average of yellow luminescence intensities of 532 (unit: a.u), and a standard deviation of 186 (unit: a.u) were obtained, and a coefficient of variation represented by (standard deviation/average of yellow luminescence intensities) was 0.35.

The Group-III element nitride semiconductor substrate according to the embodiment of the present invention may be utilized as each of the substrates of various semiconductor devices.

According to the present invention, the large-diameter Group-III element nitride semiconductor substrate including a first surface and a second surface, in which, despite its large diameter, variations in quality in the first surface are suppressed, can be provided.

Many other modifications will be apparent to and be readily practiced by those skilled in the art without departing from the scope and spirit of the invention. It should therefore be understood that the scope of the appended claims is not intended to be limited by the details of the description but should rather be broadly construed.

What is claimed is:

1. A Group-III element nitride semiconductor substrate, comprising:
    a first surface; and
    a second surface,
    wherein the Group-III element nitride semiconductor substrate has a diameter of 100 mm or more, and
    wherein the Group-III element nitride semiconductor substrate has a coefficient of variation of a yellow luminescence intensity in a range corresponding to 88% or more of an entire region of the first surface of 0.3 or less based on a photoluminescence spectrum obtained through photoluminescence measurement of a range of the entire region of the first surface.

2. The Group-III element nitride semiconductor substrate according to claim 1, wherein the coefficient of variation is 0.2 or less.

3. The Group-III element nitride semiconductor substrate according to claim 1, wherein the Group-III element nitride semiconductor substrate has a coefficient of variation of a yellow luminescence intensity in a range corresponding to 92% or more of the entire region of the first surface of 0.3 or less based on a photoluminescence spectrum obtained through photoluminescence measurement of a range of the entire region of the first surface.

4. The Group-III element nitride semiconductor substrate according to claim 3, wherein the coefficient of variation is 0.2 or less.

5. The Group-III element nitride semiconductor substrate according to claim 1, wherein a measurement interval Y in the photoluminescence measurement is 1 mm or less.

6. The Group-III element nitride semiconductor substrate according to claim 1, wherein the Group-III element nitride semiconductor substrate has a warping of 100 μm or less.

7. A Group-III element nitride semiconductor substrate, comprising:
    a first surface; and
    a second surface,
    wherein the Group-III element nitride semiconductor substrate has a diameter of 100 mm or more,
    wherein the Group-III element nitride semiconductor substrate has a coefficient of variation of a yellow luminescence intensity in a range corresponding to 88% or more of an entire region of the first surface of 0.3 or less based on a photoluminescence spectrum obtained through photoluminescence measurement of a range of the entire region of the first surface,
    wherein a measurement interval Y in the photoluminescence measurement is 1 mm or less, and
    wherein the Group-III element nitride semiconductor substrate has a warping of 100 μm or less.

8. The Group-III element nitride semiconductor substrate according to claim 7, wherein the Group-III element nitride semiconductor substrate has a coefficient of variation of a yellow luminescence intensity in a range corresponding to 92% or more of the entire region of the first surface of 0.3 or less based on a photoluminescence spectrum obtained through photoluminescence measurement of a range of the entire region of the first surface.

9. The Group-III element nitride semiconductor substrate according to claim 7, wherein the coefficient of variation is 0.2 or less.

10. The Group-III element nitride semiconductor substrate according to claim 8, wherein the coefficient of variation is 0.2 or less.

* * * * *